United States Patent [19]
Lee

[11] Patent Number: 6,163,689
[45] Date of Patent: Dec. 19, 2000

[54] NEGATIVE SELF-BIAS CIRCUIT FOR FET MIXERS

[75] Inventor: Yong Hee Lee, Seoul, Rep. of Korea

[73] Assignee: Samsung Electronics Co., Ltd., Seoul, Rep. of Korea

[21] Appl. No.: 08/941,476

[22] Filed: Sep. 30, 1997

[51] Int. Cl.[7] .............................. H04B 1/28; H04B 1/08
[52] U.S. Cl. ................... 455/323; 455/265; 455/293; 455/318; 455/326; 455/333; 327/355; 327/407; 327/431; 375/316
[58] Field of Search ................................ 455/323, 326, 455/293, 265, 311, 316, 318, 189.1, 209, 333; 375/316; 327/355, 407, 431

[56] References Cited

U.S. PATENT DOCUMENTS

| | | | |
|---|---|---|---|
| 4,541,122 | 9/1985 | Kimura | 455/333 |
| 5,606,738 | 2/1997 | Onodera et al. | 455/333 |
| 5,799,248 | 8/1998 | Vice | 455/333 |
| 5,809,411 | 9/1998 | Kudoh et al. | 455/348 |

OTHER PUBLICATIONS

"A Low cost Mixer for Wireless Applications," 1995 *IEEE MTT–S Digest*.

*Primary Examiner*—Fan Tsang
*Assistant Examiner*—Simon Nguyen
*Attorney, Agent, or Firm*—Townsend and Townsend and Crew LLP

[57] ABSTRACT

An improved mixing circuit includes a MESFET having an LO signal coupled to its gate through a charging capacitor and an RF signal coupled to its drain through a first bandpass filter. Electrons are pumped onto the charging capacitor to bias the gate of the MESFET. The MESFET drain is coupled to a second bandpass filter which passes a signal at the mixed frequency.

1 Claim, 1 Drawing Sheet

NEGATIVE SELF-BIAS CIRCUIT FOR FET MIXERS

BACKGROUND OF THE INVENTION

The recent growth of the consumer wireless communications market has created a need for low-cost, small size parts. A necessary component of many devices is a mixer.

Various configurations of mixer devices are described in an article by Jean-Marc Mourant entitled "A Low cost Mixer for Wireless Applications," 1995 *IEEE MTT-S Digest*. In particular, at FIGS. 3–5 a mixer utilizing a gate self-biased MESFET configuration is disclosed. As is apparent from the figures, that mixer utilizes a balun to couple the RF signal to the MESFET and includes an LC section which resonates at the RF frequency.

Typically, baluns are difficult to fabricate on integrated circuits and add to the cost and complexity of the circuit. Accordingly, the development of simple, inexpensive mixing circuits is important to reducing cost and complexity of wireless devices.

SUMMARY OF THE INVENTION

An improved mixing circuit does not require a balun or other transformers.

According to one aspect of the invention, a charging capacitor, coupling the LO signal to an MESFET gate terminal, is negatively charged to self-bias the MESFET.

According to another aspect of the invention, the source terminal of the MESFET is grounded and the second terminal is coupled to receive an RF signal. The MESFET mixes the LO and RF signals.

According to another aspect of the invention, the drain terminal of the MESFET is coupled to a bandpass filter which passes only a frequency which is a combination of the LO and RF frequencies.

Other features and advantages of the invention will become apparent in view of the following detailed description and appended drawings.

DESCRIPTION OF THE PREFERRED EMBODIMENT

Figure 1:
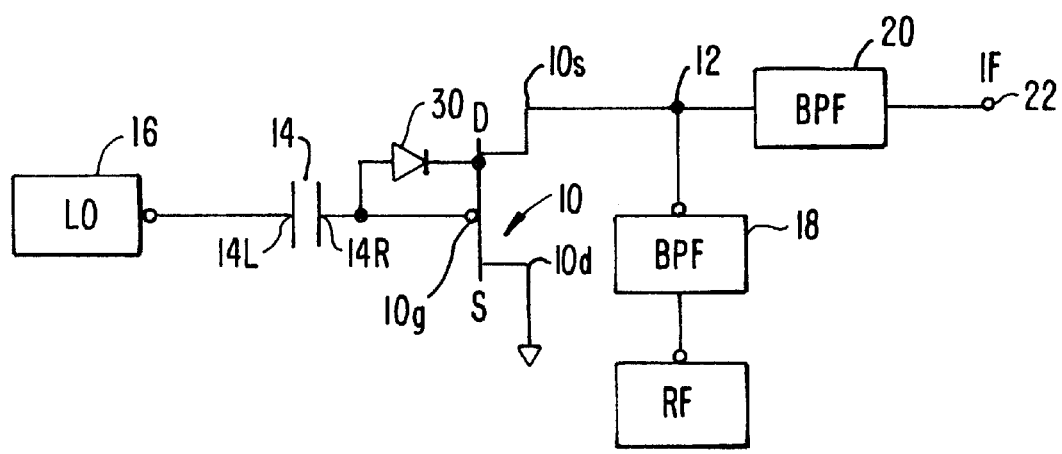
FIG. 1 is a block diagram of a preferred embodiment of the invention.

A preferred embodiment of the invention is depicted in FIG. 1. A MESFET 10 has a first (source) terminal 10*s* coupled to ground 12, a second (drain) terminal 10*d* coupled to an output node 12, and a gate 10*g* coupled to a first terminal 14*r* of a charging capacitor 14. A second terminal 14L is coupled to receive a local oscillator (LO) signal generated by a local oscillator 16. The second terminal 14L is at 0v DC.

The output node 12 is coupled to the output port of a first bandpass filter (BPF) 18 and to the input port of a second BPF 20. The input port of the first BPF 18 is coupled to an RF signal source 21 and the output port of the second BPF 20 is coupled to an intermediate frequency mixer output terminal 22.

The operation of the circuit depicted in FIG. 1 will now be described. The gate electrode of a MESFET is a Shottky diode 30 which conducts electrons from the grounded substrate to the first terminal 14*r* of the charging capacitor 14 when the LO voltage level swings positive. However, these electrons are prevented from returning to the substrate by the diode when the LO voltage swings negative. Accordingly, the electrons are pumped onto the first terminal 14*r* of the capacitor 14 and a negative voltage builds up on the first terminal 14*r* of the charging capacitor 14.

The operation of the MESFET requires that the gate be biased negatively compared to the source. Thus, by pumping electrons onto the first terminal of the pumping capacitor a negative DC bias voltage is self-generated to bias the MESFET.

The first BPF 18 couples the RF signal to the drain terminal 10*d* of the MESFET and the LO signal is coupled to the gate terminal log through the charging capacitor 14 which has a low impedance at the LO signal frequency.

The MESFET mixes the LO and RF signals to generate a signal at the sum or difference of the signal frequencies. The desired intermediate frequency is coupled to the mixer output terminal 22 by the second BPF 20 which is selected to pass the desired mixed frequency.

The gate capacitance of the MESFET is low and therefore the LO and RF signals are well-isolated.

Additionally, the negative voltage generated at the first terminal of the charging capacitor 14 can be utilized to bias other components such as an LNA or IF amp gate bias.

What is claimed is:

1. A mixer circuit for coupling signals from an RF signal source and a local oscillator, said mixer circuit comprising:

a metal-silicon field effect transistor (MESFET) having first and second terminals and a control terminal, with the first terminal coupled to ground;

an RF band-pass filter for passing only signals having an RF frequency, with the RF band-pass filter having an input port and an output port, with the input port coupled directly to the RF signal source and the output port coupled directly to said second terminal and not coupled to said control terminal;

an IF band-pass filter for passing only signals having a mixed frequency equal to a combination of an LO frequency and an RF frequency, with the IF band-pass filter having an input port and an output port, with the input port coupled directly to the second terminal and not coupled to the control terminal and where the output port provides a signal at a mixed frequency; and a charging capacitor, having first and second terminals, with the first terminal of said charging capacitor coupled to the control terminal of said MESFET and the second terminal of said charging capacitor coupled to a local oscillator and DC coupled to ground so that the first terminal is negatively charged when an LO signal is applied to the second terminal of said charging capacitor to self-bias the gate terminal of the MESFET.

* * * * *